United States Patent
Bosy et al.

(10) Patent No.: US 6,551,122 B2
(45) Date of Patent: Apr. 22, 2003

(54) LOW PROFILE PNEUMATICALLY ACTUATED DOCKING MODULE WITH POWER FAULT RELEASE

(75) Inventors: Brian J. Bosy, Framingham, MA (US); David W. Lewinnek, Somerville, MA (US)

(73) Assignee: Teradyne, Inc., Boston, MA (US)

( * ) Notice: Subject to any disclaimer, the term of this patent is extended or adjusted under 35 U.S.C. 154(b) by 0 days.

(21) Appl. No.: 09/778,694

(22) Filed: Feb. 7, 2001

(65) Prior Publication Data

US 2002/0106927 A1 Aug. 8, 2002

Related U.S. Application Data

(60) Provisional application No. 60/237,808, filed on Oct. 4, 2000.

(51) Int. Cl.[7] ............................................. H01R 4/50
(52) U.S. Cl. ..................................................... 439/348
(58) Field of Search ................................ 439/345, 348, 439/349, 953

(56) References Cited

U.S. PATENT DOCUMENTS

| | | | | |
|---|---|---|---|---|
| 2,983,978 A | * | 5/1961 | Wilgus ........................ 279/75 |
| 4,980,800 A | * | 12/1990 | Furuta ..................... 200/50.01 |
| 5,002,500 A | * | 3/1991 | Zuccaro et al. ............. 439/197 |
| 5,068,601 A | | 11/1991 | Parmenter ............... 324/158 F |
| 5,138,291 A | * | 8/1992 | Day ........................... 335/258 |
| 5,744,974 A | | 4/1998 | Bogden ...................... 324/758 |
| 5,821,764 A | | 10/1998 | Slocum et al. .............. 324/758 |
| 5,923,180 A | | 7/1999 | Botka et al. ................. 324/758 |
| 5,982,182 A | | 11/1999 | Chiu et al. .................. 324/754 |

FOREIGN PATENT DOCUMENTS

EP          0699913          3/1996     ........... G01R/1/073

* cited by examiner

Primary Examiner—Lynn D. Feild
Assistant Examiner—Phuong K T Dinh
(74) Attorney, Agent, or Firm—Bruce D. Rubenstein

(57) ABSTRACT

A docking mechanism for docking a test head with a peripheral includes a latching mechanism that extends from a pneumatically actuated piston. The latching mechanism includes a latch barrel, a latchpin, and a biasing spring. The latchpin moves within the latch barrel for establishing latched and unlatched positions. An application of fluid pressure to the latchpin via a first fluid path causes the latchpin to advance to the latched position. A release of fluid pressure from the first path causes the latchpin to retract, in compliance with the biasing spring, to the unlatched position. An application of fluid pressure via a second fluid path to a surface of the piston causes the latching mechanism as a whole to retract. When the test head and peripheral are latched together, this retraction causes the peripheral to be pulled down against the test head, and thus causes electrical connections to be formed between the test head and a device under test. Because the docking mechanism is actuated by fluid pressure, it can be constructed with a very low profile, to have a relatively small impact on the placement of other equipment in its area. Because it unlatches upon the release of fluid pressure, the docking mechanism allows a test head and a peripheral to be easily separated upon an accidental loss of power.

25 Claims, 6 Drawing Sheets

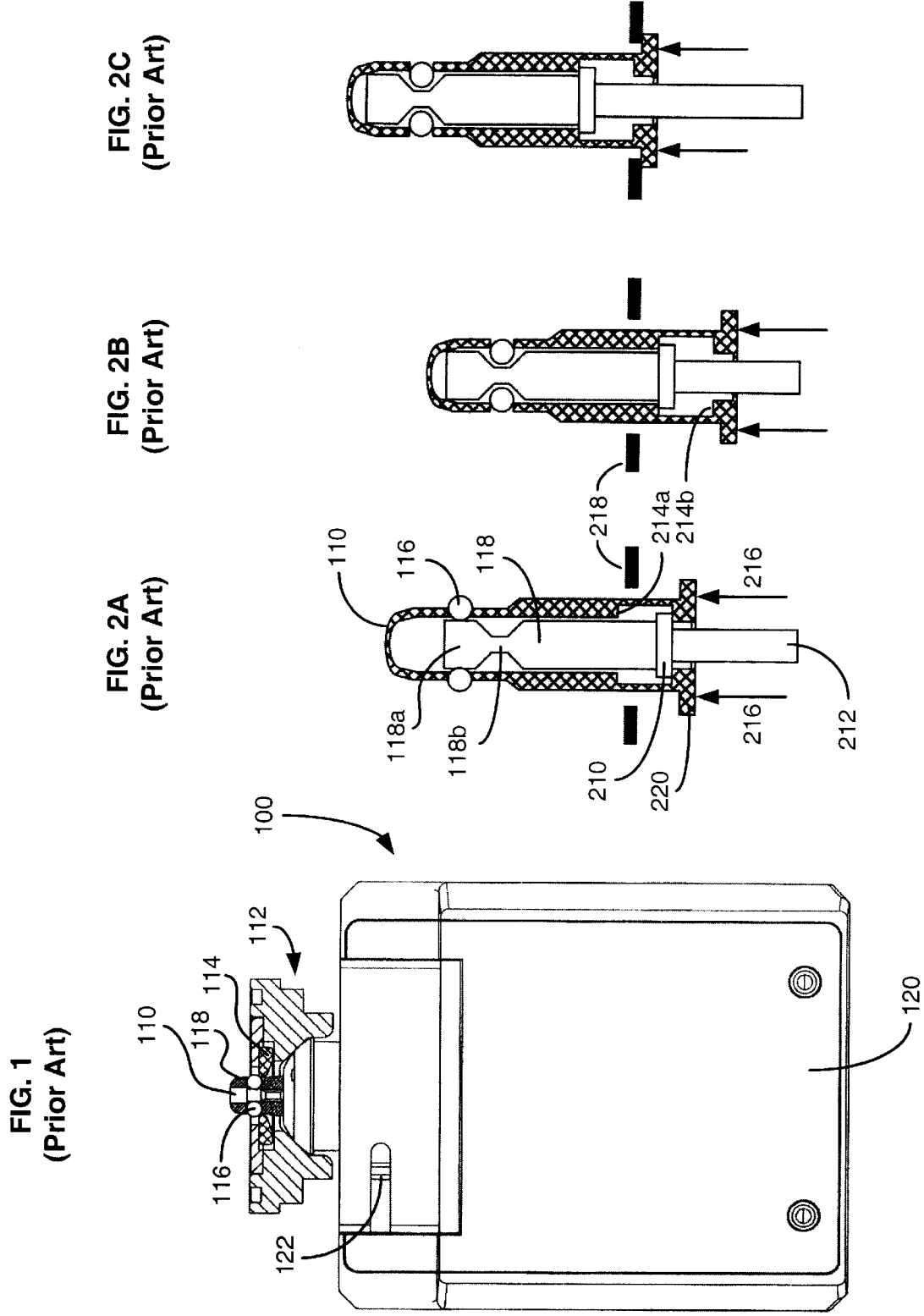

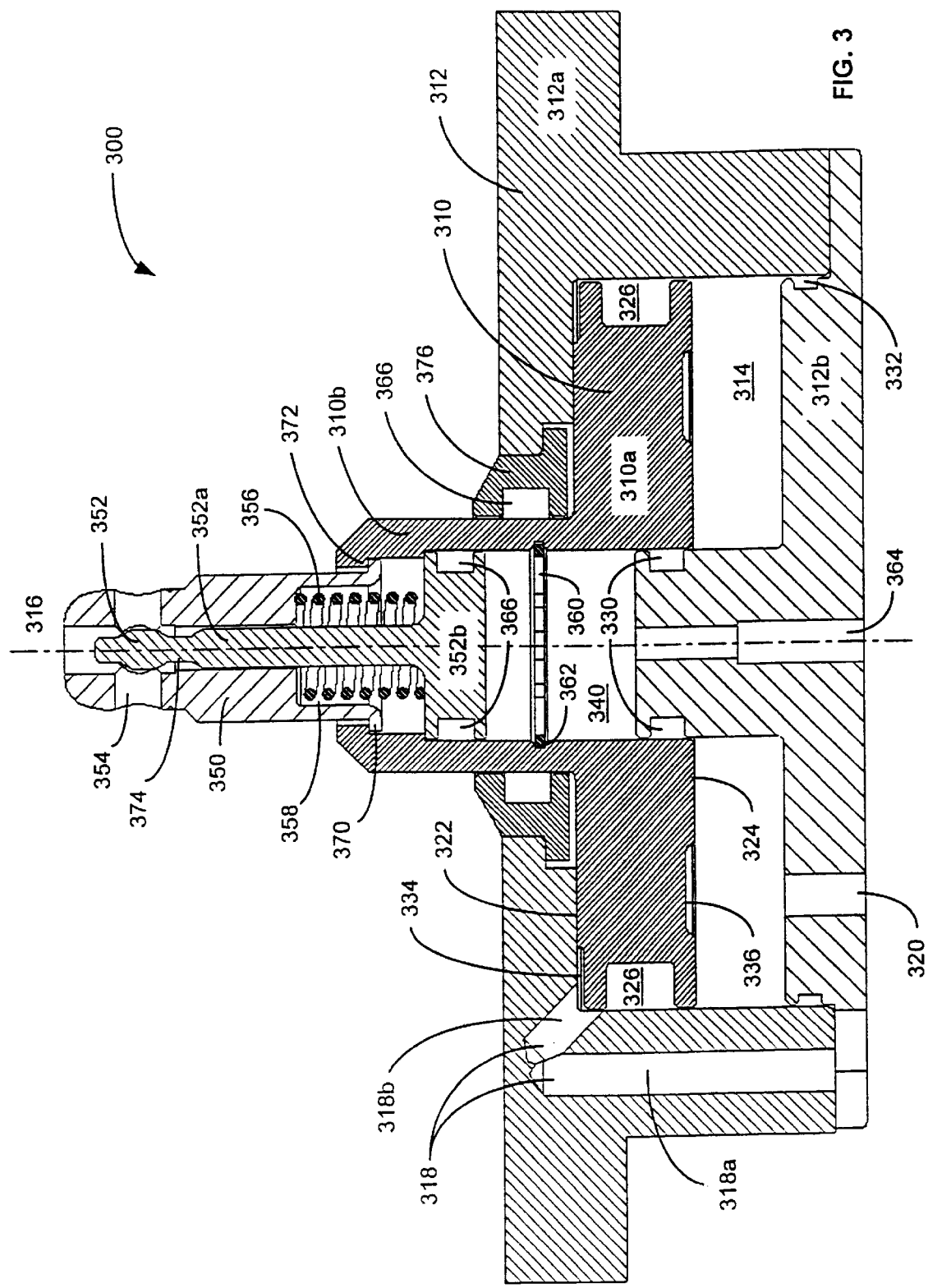

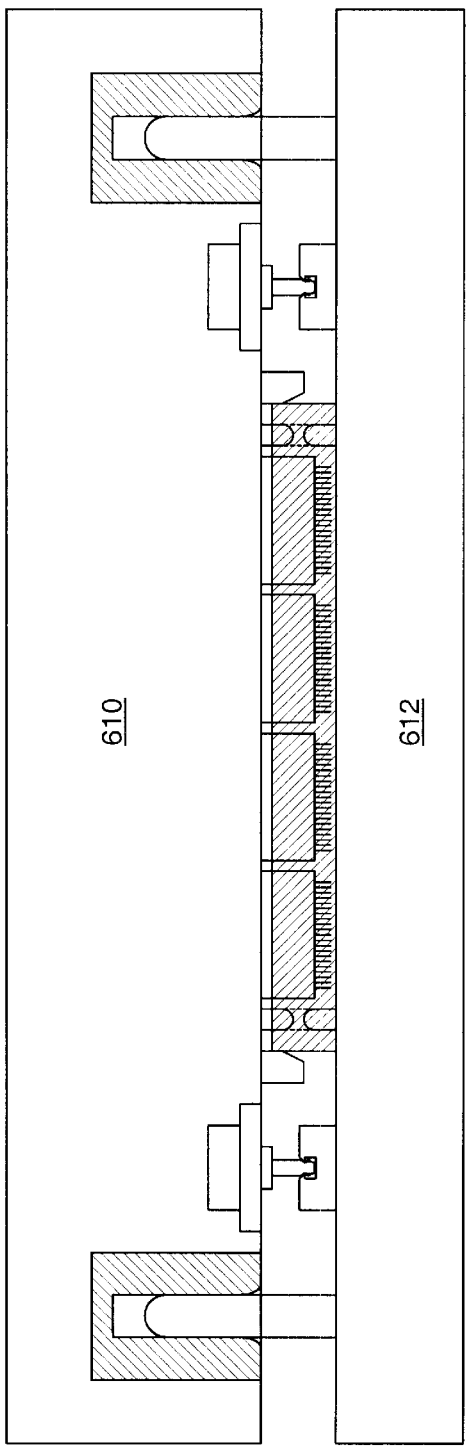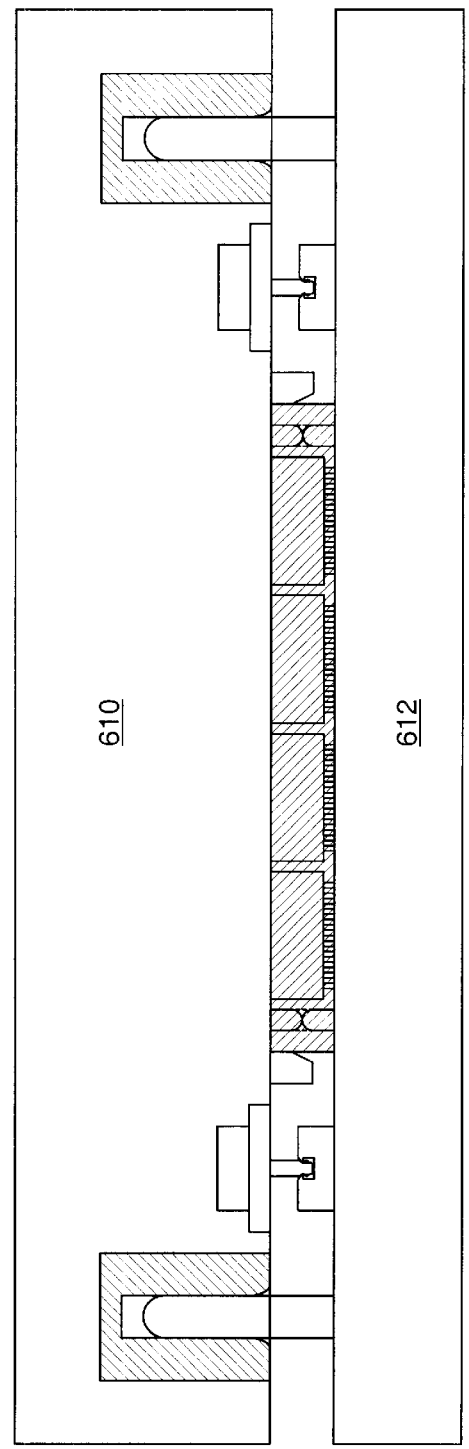

LOW PROFILE PNEUMATICALLY ACTUATED DOCKING MODULE WITH POWER FAULT RELEASE

This application claims the benefit of provisional application 60/237,808 filed Oct. 4, 2000.

This invention relates generally to automatic test equipment. More particularly, this invention relates to a device for mechanically attaching automatic test equipment with machinery that positions semiconductor devices for testing.

BACKGROUND OF THE INVENTION

Semiconductor manufacturers generally test semiconductor devices at various stages of production. During manufacturing, integrated circuits are fabricated in large quantities on a single silicon wafer. The wafer is cut into individual integrated circuits called dies. Each die is loaded into a frame, and bonding wires are attached to connect the die to leads that extend from the frame. The loaded frame is then encapsulated in plastic or another packaging material to produce a finished product.

Manufacturers have a strong economic incentive to detect and discard faulty components as early as possible in the manufacturing process. Accordingly, many semiconductor manufacturers test integrated circuits at the wafer level, before a wafer is cut into dies. Defective circuits are marked and generally discarded prior to packaging, thus saving the cost of packaging defective dies. As a final check, many manufacturers test each finished product before it is shipped.

To rapidly test large quantities of semiconductor components, manufacturers commonly use automatic test equipment ("ATE" or "testers"). In response to instructions in a test program, a tester automatically generates input signals to be applied to an integrated circuit, and monitors output signals. The tester compares the output signals with expected responses to determine whether the device under test, or "DUT," is defective. Because testers are highly automated, they can run millions of tests in only a few seconds.

Customarily, component testers are designed in two different portions. A first portion, called a "test head," includes circuitry that is preferably located close to the DUT, for example, driving circuitry, receiving circuitry, and other circuitry for which short electrical paths are essential. A second portion, called a "tester body," is connected to the test head via cables, and contains electronics that are not required to be close to the DUT.

Special machines move and electrically connect devices to a tester in rapid succession. A "prober" is used to move devices at the semiconductor wafer level. A "handler" is used to move devices at the packaged device level. Probers, handlers, and other devices for positioning a DUT relative to a tester are generically known as "peripherals." Peripherals generally include a site where DUTs are positioned for testing. The peripheral rapidly feeds a DUT to the test site, the tester tests the DUT, and the peripheral moves the DuT away from the test site, so that another DUT can be tested.

The test head and peripheral are separate pieces of machinery that generally have separate support structures. Therefore, before testing can begin it is necessary for the test head and the peripheral to be attached together. In general, this is accomplished by moving the test head toward the peripheral, carefully aligning the test head, and latching the test head to the peripheral. Once latched, a docking mechanism pulls the test head and peripheral together, causing spring-loaded contacts between the test head and peripheral to compress and form electrical connections between the tester and the DUT. This process of aligning and attaching the test head to the peripheral is commonly known as "docking."

FIG. 1 illustrates a conventional mechanism for docking a test head to a peripheral. The docking mechanism of FIG. 1 is customarily used in conjunction with the Catalyst™ test system, provided by Teradyne, Inc. of Boston, Mass. As shown in FIG. 1, a docking mechanism 100 is attached to a receptacle 112. Several docking mechanisms 100 are generally attached to the outside of a test head near the top of the test head. Several receptacles are generally attached to a peripheral, in complementary locations that allow the docking mechanisms 100 to mate with the receptacles 112. The docking mechanism 100 and receptacle 112 of FIG. 1 are shown in a fully docked configuration, i.e., in the configuration they assume for electronically testing devices.

As shown in FIG. 1, the docking mechanism 100 includes a latch barrel 110 and a latchpin 118 that runs axially within the latch barrel 110. Four ball bearings 116 are positioned within holes in the latch barrel 110, around the circumference of the latchpin 118. The outer entrances to the holes are slightly deformed from perfect circles (not visible in the figure). The deformed regions form a barrier that prevents the ball bearings 116 from falling out of the latch barrel 110.

The latchpin 118 has different portions 118a and 118b along its length, and the different portions have different diameters. To effect latching and unlatching, the latchpin 118 advances and retracts with respect to the latch barrel 110. As the latchpin 118 moves, the portion of the latchpin that 118 makes contact with the ball bearings 116 changes. As a result, the radial positions of the ball bearings 116 change. For example, when the portion 118a of the latchpin with a relatively large diameter aligns with the ball bearings 116, the ball bearings extend outwardly from the center of the latch barrel 110, increasing the effective circumference of the latch barrel 110. When the portion 118b of the latchpin 118 with a relatively small diameter aligns with the ball bearings 116, the ball bearings are free to collapse inwardly, reducing the effective circumference of the latch barrel 110.

The receptacle 112 includes a washer 114 having an inner diameter just slightly larger than the outer diameter of the latch barrel 110 with the ball bearings 116 fully retracted. Depending upon the position of the latchpin 118 relative to the latch barrel 110, the ball bearings 116 either prevent the washer 114 and latch barrel 110 from separating, or allow the washer 114 to freely slide off and on the latch barrel 110.

An actuator 120 establishes the position of the latchpin 118. The latchpin 118 has a threaded portion (not visible) that extends into the actuator 120. The actuator 120 includes a nut (not visible) that has a fixed position relative to the actuator 120 and engages the threaded portion of the latchpin 118. The latchpin can be rotated under control of a motor and gears (not visible) that reside within the actuator 120. Depending upon the direction of rotation, the latchpin 118 either advances or retracts relative to the actuator 120.

FIGS. 2A–C illustrate various configurations that the docking mechanism 100 assumes during normal use. FIG. 2A shows the docking mechanism 100 in a "ready-to-latch" configuration—prior to the latch barrel 110 being inserted into the receptacle 112. The latchpin 118 is fully retracted. A spring (not shown) exerts an upward force 216 on the latch barrel 110 (base region 220) relative to the latchpin 118, so that the a tab 210 extending from the latchpin 118 rests against a lower inside shoulder 214b of the latch barrel 110. The first portion 118a of the latchpin with the relatively large diameter rests against the ball bearings 116, and the ball bearings 116 partially protrude through the holes in the latch barrel 110.

FIG. 2B shows the docking mechanism 100 at the instant that the latch barrel 110 is inserted into the receptacle 112 (not shown). As the latch barrel 110 is inserted into the receptacle 112, the washer 114 catches the ball bearings 116 and exerts a downward force on them. The latch barrel 110 is then pushed downwardly, and the ball bearings 116 are moved into contact with the relatively narrow portion 118b of the latchpin 118. The ball bearings collapse inwardly, and the latch barrel 110 enters through the washer 114 of the receptacle 112. Once the ball bearings 116 clear the washer 114, the latch barrel 110 springs upwardly in response to the spring force 216. The receptacle 112 is then firmly held in place by the docking mechanism 100.

FIG. 2C shows the docking mechanism 100 in an unlatched configuration. Here, the latchpin 118 is advanced so that the tab 210 of the latchpin 118 presses against an inner upper shoulder 214a of the latch barrel 110, and the base 220 of the latch barrel 210 presses against a fixed stop 218. The fixed stop 218 has fixed position relative to the actuator 120. In this configuration, the relatively narrow portion 118b of the latchpin 118 aligns with the ball bearings 216, and the ball bearings 116 are free to collapse inwardly. The docking mechanism 100 can then be freely inserted into and withdrawn from the receptacle 112.

In addition to the configurations illustrated in FIGS. 2A–2C, the latch pin can also assume the fully docked configuration, like that shown in FIG. 1. The fully docked configuration is identical to the configuration shown in FIG. 2A, except that the latchpin 118 and latch barrel 110 are pulled down by the actuator 120. The fully docked configuration provides closer contact between the test head and the peripheral, and thus allows electrical connections to be made between the test head and the peripheral by compressing spring-loaded contacts, as described above.

Although the docking mechanism 100 has proven to be highly effective, we have recognized new requirements that make its use less attractive for certain future applications. In particular, testers have recently been developed with test heads that are significantly larger than the test head used in the Catalyst™ test system. The increased size of the test head has necessitated that the docking mechanisms be relocated from the sides of the test head to top of the test head. However, the top of the test head is densely crowded with electronics and other components and cannot easily accommodate the vertical space required by the docking mechanisms 100.

In addition, a loss of power to the latching mechanism 100 causes the latching mechanism 100 to hold its position. If the test head and peripheral are docked together when a loss of power occurs, an operator must manually access the actuator 120 to undock them. In particular, the operator must rotate a shaft 122 within the actuator 120—generally using a crescent wrench—to manually spin the gears within the actuator 120 and move the latchpin 118. If the latching mechanism is located at the top of the test head instead of at its sides, the operator would not be able to access to the shaft 122, and the test head could not be easily undocked from the peripheral.

SUMMARY OF THE INVENTION

With the foregoing background in mind, it is an object of the invention for a docking mechanism to require little vertical space compared with conventional docking mechanisms.

It is another object of the invention for a docking mechanism not to require direct access by an operator to establish an undocked condition in the event of a loss of power.

To achieve the foregoing objects and other objectives and advantages, a docking mechanism suitable for docking a test head with a peripheral includes a piston and a hollow cylindrical chamber. The piston has a first portion movably disposed within the chamber and a second portion extending from the first portion and through a hole the chamber. A latch barrel, suitable for attaching to a receptacle, extends from an opening in the second portion of the piston. A latchpin is moveably disposed within the latch barrel for establishing latching and unlatching conditions. A biasing force, provided for example by a spring, tends to bias the position of the latchpin relative to the latch barrel to the unlatched condition. By applying an active force to the latchpin, the latchpin can: be moved against the biasing force within the latch barrel for establishing the latched condition. When the active force is removed, for example upon a loss of power, the biasing force restores the latchpin to the unlatched condition. By applying fluid pressure to a surface of the piston, the piston can be moved relative to the chamber, and the extension of the latch barrel relative to the chamber can be varied.

BRIEF DESCRIPTION OF THE DRAWINGS

Additional objects, advantages, and novel features of the invention will become apparent from a consideration of the ensuing description and drawings, in which FIG. 1 is a drawing of docking mechanism of the prior art attached to a receptacle;

FIGS. 2A–2C are cross-sectional drawings that show different latching configurations of the docking mechanism of FIG. 1;

FIG. 3 is a cross-sectional view of a docking mechanism constructed in accordance with the invention;

FIGS. 6A–6C show a sequence for docking a test head with a peripheral using the docking mechanism of FIGS. 3–5.

DESCRIPTION OF THE PREFERRED EMBODIMENT

Structure of Docking Mechanism

Figure 4:
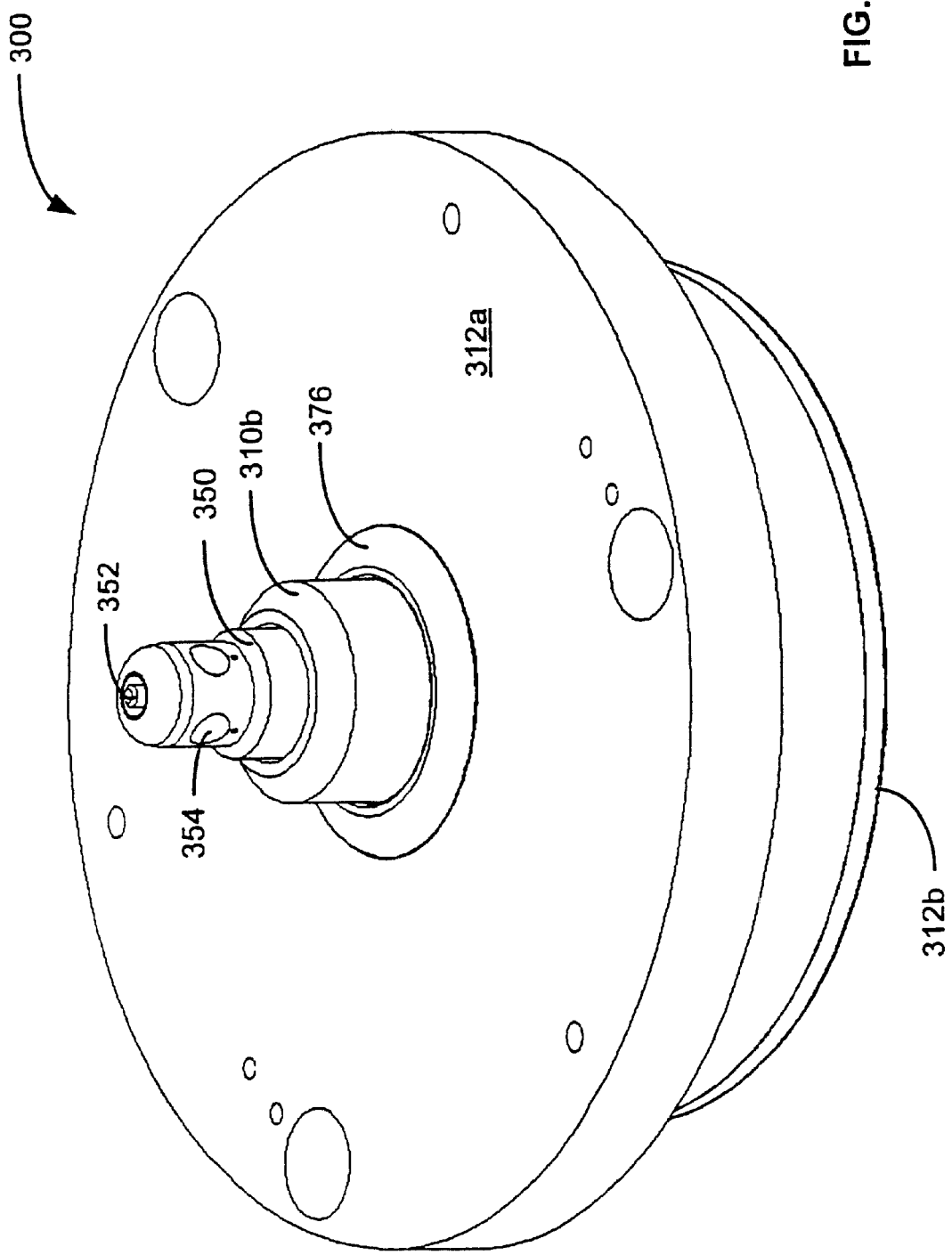
FIG. 4 is a perspective view of the docking mechanism of FIG. 3.

FIG. 3 is a cross-sectional view of a docking mechanism 300 according to the invention, which shows the structure of the docking mechanism 300 in detail. FIG. 4 is a perspective view of the same docking mechanism 300. As shown in FIG. 3, the docking mechanism 300 includes a piston 310 and a substantially cylindrical chamber 312. The piston 310 includes a first portion 310a disposed within an internal region 314 of the chamber 312 and a second portion 310b that extends from the first portion 310a. The second portion 310b extends partially outside the chamber 312 through an opening at the top of the chamber 312. The chamber 312 preferably includes a top portion 312a and a base portion 312b attached to the top portion 312a using fasteners, for example, screws.

Fluid conduction paths 318 and 320 are respectively provided through the top portion 312a and base portion 312b of the chamber 312, for applying fluid pressure to upper and lower surfaces 322 and 324 of the piston 310. In response to a fluid pressure applied via the fluid conduction path 318, the piston 310 is forced in a downward direction, causing the second portion 310b of the piston to retract into the chamber 312. In response to fluid pressure applied via the fluid conduction path 320, the piston 310 is forced in an upward direction, causing the second portion 310b of the piston to extend at least partially outside the chamber 312.

Because it is convenient and relatively maintenance free, air is preferably used as the fluid for conveying fluid pressure to the upper and lower surfaces 322 and 324 of the piston 310. O-ring seals are provided around the circumference of the chamber 312, at locations 326, 328, 330, and 332, to prevent fluid leakage. Air pressure is preferably maintained at approximately 80 p.s.i.

Significant force is generally required to move the piston 310 relative to the chamber 312. Therefore, the piston 310 preferably includes relieved regions 334 and 336. The relieved regions preferably extend around the full circumference of the piston 310. When the piston 310 is fully extended to the top of the chamber 312, the relieved region 332 ensures that fluid pressure applied from the conduction path 318 acts against a known surface area of the piston. Because force applied to the piston 310 equals fluid pressure times surface area, the surface area of the relieved region 322 translates directly to a known, initial force for moving the piston. Once the piston begins to move, the entire upper surface 322 of the piston 310 becomes exposed to the fluid pressure from the path 318, and the force behind the piston greatly increases.

In a similar manner, the relieved region 334 ensures the fluid pressure from the path 320 initially acts against a known surface area for producing a known force for moving the piston in an upward direction, when the piston 310 is initially positioned against the bottom of the chamber 312.

To simplify construction, the fluid conduction paths 318 and 320 are preferably provided as holes drilled in the upper and base portions 312a and 312b of the chamber 312, respectively. The first fluid conduction path 318 preferably comprises two holes, a first hole 318a drilled up from the bottom but not through the upper portion of the chamber 312, and a second hole 318b drilled diagonally from within the chamber and breaking into the first hole. The second fluid conduction path 320 is simply a hole drilled though the base portion 312b. The holes 318 and 320 are sized to mate with conventional air hose couplings (not shown), which convey compressed air to the fluid conduction paths 318 and 320.

In general, fluid pressure is applied to the first fluid conduction path 318 to push the piston 310 downwardly into the chamber 312 (for example, when pulling down a peripheral toward a test head). During this phase, the second fluid conduction path 320 is preferably maintained at atmospheric pressure. To push the piston 310 upwardly within the chamber, fluid pressure is applied to the second fluid conduction path 320, and the first path 318 is preferably maintained at atmospheric pressure.

By controlling the position of the piston 310, the docking mechanism 300 controls the relative position of the test head with respect to the peripheral, i.e., whether the peripheral is "pulled down" against the test head. In addition, the docking mechanism 300 also controls the ability of the docking mechanism 300 to latch and unlatch with a receptacle 112 attached to the peripheral.

To effect latching and unlatching with a receptacle 112, the second portion 310b of the piston includes a hollow, substantially cylindrical region 340. A latch barrel 350 extends from an opening at the top of the cylindrical region 340, and a latchpin 352 extends axially through the center of the latch barrel 350 and can move up and down with respect to the latch barrel 350. In a manner similar to that discussed above with reference to FIG. 1, the relative position of the latchpin 352 with respect to the latch barrel 350 determines whether a latching or an unlatching condition is established. Ball bearings (not shown) are disposed within holes 354 around the circumference of the latch barrel 350. As with the docking mechanism 100 of FIG. 1, the diameter of the latchpin at the point of contact with the ball bearings causes the ball bearings to either extend outwardly to effect a latched condition or to collapse inwardly to effect an unlatched condition.

In contrast with the docking mechanism of FIG. 1, the latchpin 352 preferably includes an elongated portion 352a and a base portion 352b. A biasing mechanism, for example a spring 356, exerts a biasing force between the latchpin 352 and the latch barrel 350. The biasing force pushes the latchpin 352 in a downward direction with respect to the latch barrel 350, tending to effect the unlatched condition. The spring 356 is preferably disposed within an open region 358 of the latch barrel 350, concentrically around the elongated portion 352a of the latchpin 352. A snap-ring 360 fits within a circular groove 362, to establish a lower limit for the position of the latchpin 352 within the latch barrel 350.

To move the latchpin 352 in an upward direction with respect to the latch barrel 350, fluid pressure is applied to the base portion 352b of the latchpin 352. For convenience, the fluid used to supply the fluid pressure is preferably air. A third fluid conduction path 364 is provided through the base portion 312b of the chamber 312, preferably via a hole drilled through the base portion 312b of the chamber 312. As with the holes for the first and second conduction paths 318 and 320, the hole for the third conduction path 364 is preferably dimensioned to mate with conventional air hose couplings.

When fluid pressure is applied via the third fluid conduction path 364, the latchpin 352 is urged upwardly, against the biasing force of the spring 356. The spring 356 is compressed, and the latchpin 352 is advanced within the latch barrel 350 to effect the latched condition. An o-ring is preferably provided at location 366 to prevent a leakage of fluid pressure.

When the fluid pressure applied via the third fluid conduction path 364 is released, the pressure in the cylindrical region 340 approaches atmospheric pressure, and the biasing force of the spring 356 pushes downwardly on the latchpin 352. The latchpin moves downwardly in compliance with the biasing force to establish the unlatched condition.

Upon a loss of electrical power, the fluid pressure drops to atmospheric pressure. Thus, the same sequence of events ensues as when pressure is released. The latchpin 352 thus moves in compliance with the biasing force to the unlatched condition. Thus, a loss of electrical power, caused for example by a power failure, causes the docking mechanism 300 to unlatch. The test head and peripheral can then be easily separated without requiring an operator to directly access the docking mechanism or use special tools.

In the preferred embodiment, an air compressor (not shown) provides fluid pressure to the first, second, and third conduction paths 318, 320, and 364 via a bank of electronically actuated valves (i.e., a manifold). The valves each operate in response to an electronic control signal. Each of the valves has a pressurized input port from the compressor, an exhaust input port, and an output port coupled via a hose to one of the first, second, and third conduction paths. Upon an assertion of the electronic control signal for one of the valves, the valve conducts air between the pressurized input port and the output port, thus providing pressurized air to the respective conduction path of the docking mechanism 300. Upon a de-assertion of the electronic control signal—or a loss of power—the valve assumes a default state in which the pressurized input port is blocked and the exhaust port is coupled to the output port. Under these circumstances, atmospheric pressure is provided to the respective conduction path.

Preferably, the latch barrel 350 is not fixedly attached to the second portion 310b of the piston 310. Instead, the latch barrel 350 has a shoulder 370 that extends around its outer circumference and loosely engages a lip 372 that extends around an inner circumference at the opening of the second portion 310b of the piston. Normally, the latch barrel 350 is held in place by the biasing force of the spring 356 pushing upwardly on the latch barrel 350. During latching, however, a receptacle 112 can push the latch barrel 352 downwardly with respect to the second portion 310b of the piston.

With the latchpin 352 in its latched (upper) position, the latch barrel 350 can be inserted into a receptacle 112. The action of inserting the latch barrel into the receptacle causes the receptacle to force the latch barrel 350 downwardly with respect to the latchpin 352. An unlatched condition is momentarily established, in which the ball bearings around the latchpin 352 collapse inwardly around a narrow region 374 of the latchpin. Once the receptacle clears the ball bearings, the latch barrel 350 springs upwardly, reestablishing the latched condition with the receptacle 112 held firmly in place.

Materials

The docking mechanism 300 is preferably mounted to the top of the test head, and the receptacle is preferably attached to the peripheral, such as a prober or handler. To keep the weight of the test head relatively low, the chamber 312 of the docking mechanism 300 is preferably constructed from a lightweight, strong material such as aluminum. For strength and resilience, the piston 310 is preferably stainless steel A brass, cylindrical insert 376 is preferably provided within the opening at the top of the chamber 312, to prevent the piston 310 and the walls of the chamber 312 from being damaged as the piston 310 moves up and down within the chamber 312. The brass insert is preferably press-fit into the upper portion 310a of the chamber.

The o-rings provided at locations 326, 328, 330, 332, and 366 are preferably composed of rubber. Conventional o-ring grease is applied to the o-rings to ensure an air-tight seal.

The spring 326 is preferably a simple coil spring that provides approximately 10 lbs. of force at full compression. The force of the spring must be sufficient to overcome the seal drag induced by the o-ring at location 366, to establish an unlatched condition when pressure to the latchpin is relieved.

Configurations of Docking Mechanism

The docking mechanism 300 allows its constituent components to be positioned in essentially three ways:
the piston 310 can be either up or down within the chamber 312;
the latchpin 352 can be either up and down within the second portion 310b of the piston 310; and
the latch barrel 350 can be either up and down within the second portion 310b of the piston 310.

Ignoring intermediate positions of these components (i.e., between up and down), there are a total of eight possible configurations of the docking mechanism 300. Of these, four are particularly relevant to the problem of docking a test head with a peripheral. These configurations are illustrated in FIGS. 5A–5D.

Figure 5A:
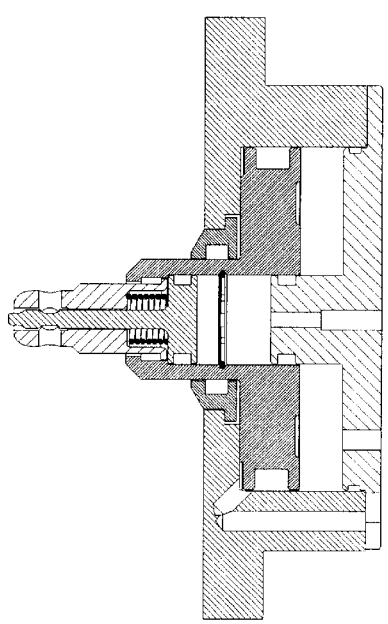
FIGS. 5A–5D show a sequence of latching configurations of the docking mechanism of FIGS. 3 and 4.

FIG. 5A shows the docking mechanism 300 in a "ready-to-latch" configuration. The piston 310 is up (not pulled-down), the latchpin 352 is up (latched), and the latch barrel 350 is up. In this configuration, the docking mechanism 300 has not yet been inserted into a receptacle.

Figure 5B:
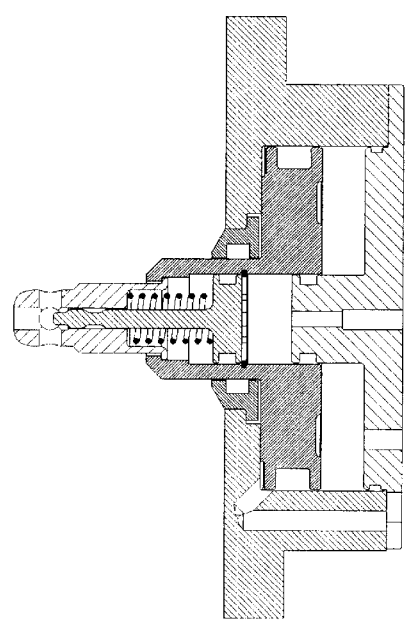

FIG. 5B shows the docking mechanism 300 in a "latching" configuration. This configuration is identical to the ready-to-latch configuration of FIG. 5A, except that the latch barrel 350 is in the down position. The latching configuration is established at the instant the latch barrel 350 is inserted into a receptacle. A washer (not shown) within the receptacle pushes down on the ball bearings within the latch barrel 350, causing the latch barrel to depress and the spring 356 to compress. Once the washer clears the ball bearings, the latch barrel 350 springs back up. The ready-to-latch configuration of FIG. 5A is then reestablished. At this point, the receptacle is firmly held beneath the ball bearings around the latch barrel 350.

Figure 5C:
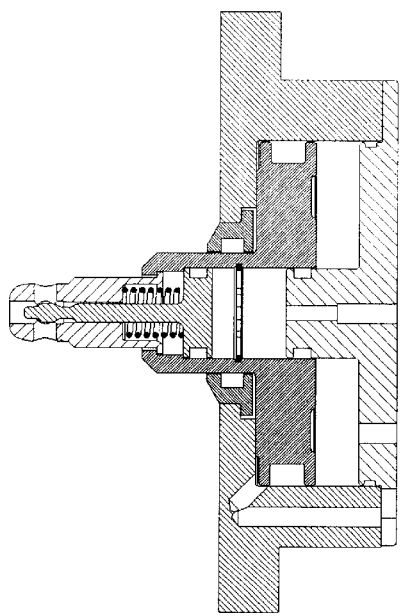

In FIG. 5C, the docking mechanism 300 is shown in a "pulled-down" configuration. The docking mechanism 300 has already been latched to the receptacle. The piston 310 is actuated to its down position to pull the test head and peripheral together. The force of the piston 310 compresses spring contacts within the test head and peripheral, and thus allows the tester to make electrical connections with the device under test. The docking mechanism maintains this configuration until testing is complete.

Figure 5D:
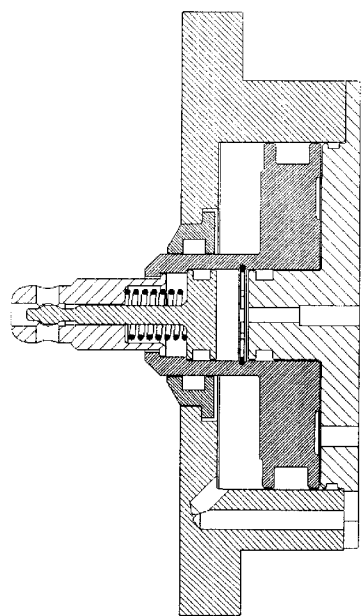

Once testing is finished, the docking mechanism 300 assumes an "unlatched" configuration, as shown in FIG. 5D. The piston 310 is moved to its up position (not pulled-down), and the latchpin 352 is moved to its down position (unlatched). In the unlatched configuration, the test head and peripheral can separated simply by pulling them apart.

Upon an accidental loss of power, the docking mechanism 300 assumes the unlatched configuration of FIG. 5D. As described above, a loss of power causes the pressure supplied from the manifold to drop to atmospheric pressure. Because springloaded contacts within the test head and peripheral tend to repel the test head from the peripheral, the spring-loaded contacts tend to back-drive the piston 310 to its up position. Within the latch barrel 350, the spring 356 pushes the latchpin 352 to its down position, and the docking mechanism 300 becomes unlatched from the receptacle.

Sequence for Docking Test Head with Peripheral

Figure 6A:
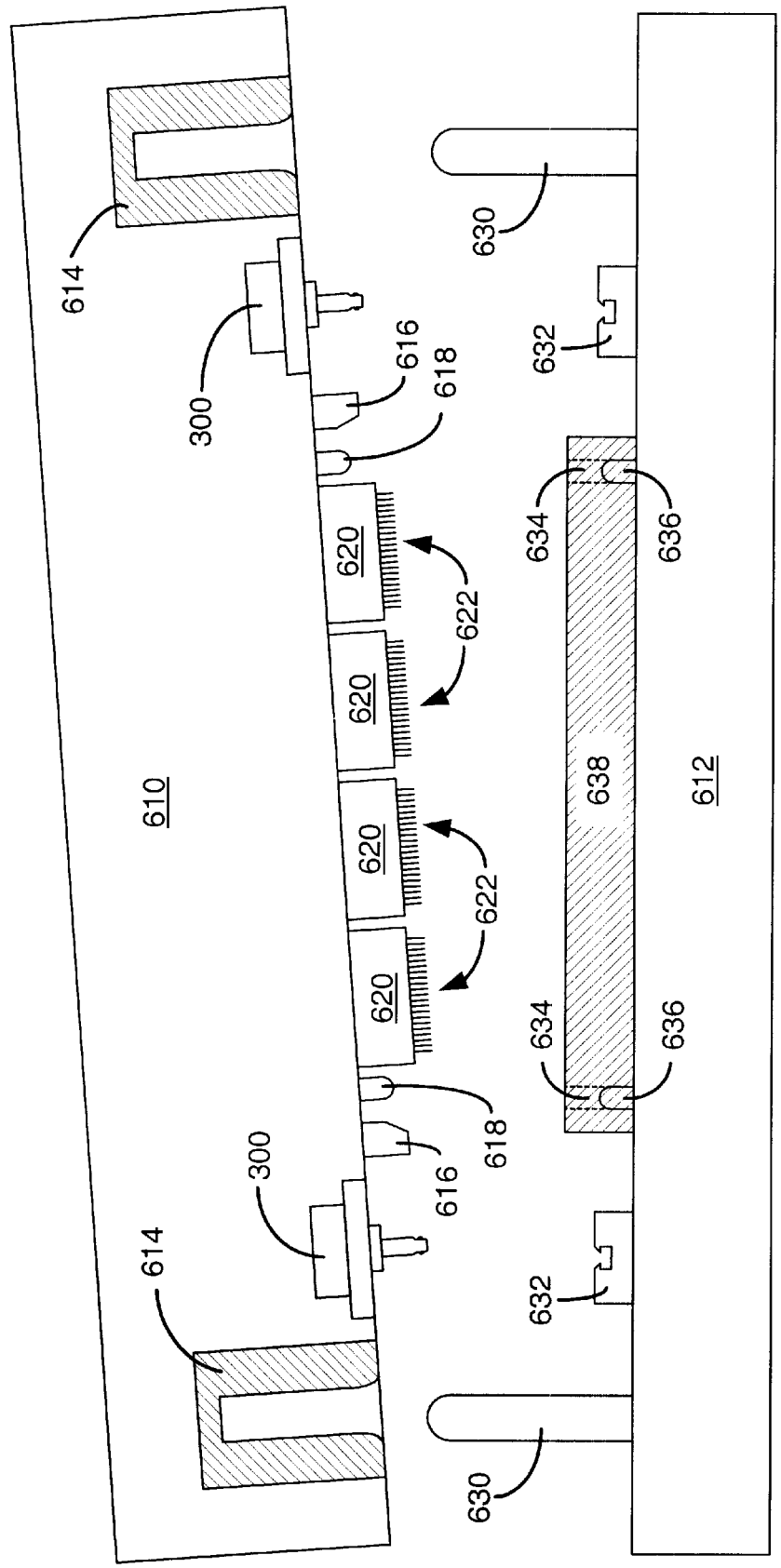

FIGS. 6A–6C show a sequence for docking a test head 610 with a peripheral 612 using the docking mechanism 300. These figures do not exhaustively show all the components involved in docking, and are not drawn to scale. Instead, they are highly simplified drawings provided to show the general principles involved in docking a test head with a peripheral.

As shown in FIG. 6A, a test head 610 includes a pair of docking mechanisms 300, a pair of outer alignment bushings 614, a pair of tapered guide posts 616, and a pair of DIB (device interface board) alignment pins 618. Probe towers 620 extend from the test head 610, for conveying electrical signals from a DIB (not shown) within the test head 610 to the peripheral 612. Spring-loaded contact pins 622 extend from the probe towers 620 for establishing electrical connections with the peripheral 612.

The peripheral 612 includes a pair of outer alignment pins 630, which are positioned for engaging the outer alignment bushings 614 of the test head 610. Receptacles 632 are positioned at the outside of the peripheral 612 for receiving the latch barrels 350 projecting from the docking mechanisms 300. DIB alignment bushings 634 within a DIB alignment bracket 638 receive inner alignment pins 636, which extend from the peripheral 612. In addition, the DIB alignment bushings 634 are adapted for receiving the DIB alignment pins 618 projecting from the test head 610.

When the test head and peripheral are initially brought together for docking, they need not be perfectly aligned. In general; the test head 610 is moved under machine control to a rough position and orientation relative to the peripheral 612, such as that shown in FIG. 6A. Once a rough position and orientation is established, an operator generally moves the test head 610 under manual control to latch the test head and the peripheral together.

FIG. 6B shows the positions of the test head 610 and the peripheral 612 after the operator latches them together. The outer alignment pins 630 engage the outer alignment bushings 614, the DIB alignment pins 618 engage the DIB alignment bushings 634, and the docking mechanisms 300 engage the receptacles 632. Note that the spring-loaded contacts 622 are not yet compressed.

To complete the docking sequence, the docking mechanisms 300 are simultaneously actuated to their pulled-down states (see FIG. 5C). The pulling action of the docking mechanisms 300 causes the spring-loaded pins 622 to compress, thus forming electrical connections between the test head 610 and the peripheral 612. High-speed testing of semiconductor devices can then be commenced.

Advantages

From the foregoing description, it is apparent that the docking mechanism 300 can be constructed with a very low profile, to easily fit within the top surface of a test head. Thus, the docking mechanism 300 does not significantly interfere with other critical equipment within the test head. Preferably, the docking mechanism 300 lies flush with the top surface of the test head, and is no thicker than the test head's top cover.

It is also apparent that the docking mechanism automatically unlatches upon a loss of power. Therefore, it is not necessary for an operator to use special tools to manually disengage the test head from the peripheral. Nor is it necessary for the operator to gain physical access to the docking mechanism 300 after a loss of power.

As an additional benefit, the hoses that convey fluid pressure to the docking mechanism remain in stationary positions, regardless of the docking mechanism's configuration. It is believed that the stationary positions of the hoses promote longer life of the hoses, and reduce the likelihood that the hoses will become disengaged from the docking mechanism 300 over the life expectancy of the product.

Alternatives

In addition to the preferred embodiment and the variations described above, other embodiments and variations can be made.

For example, the latchpin 352 as described above is actuated upwardly by fluid pressure and is biased downwardly by a spring 356. Alternatively, a solenoid can be used to both actuate and bias the latchpin 352. When power is applied to the solenoid, the solenoid advances the latchpin 352 to the latched position. When power is removed from the solenoid, the solenoid retracts the latchpin 352 to the unlatched position. In this scenario, the spring 356 is not necessary, because the solenoid returns the latchpin to the unlatched position whenever power is removed. Relatively little force is required to move the latchpin. Therefore, the solenoid and associated electronic control circuitry can be quite small, and do not sacrifice the low profile of the docking mechanism 300.

The biasing mechanism is described above as a spring 356. However, other biasing mechanisms could be used, for example, an elastomeric material, a permanent magnet, or another mechanism that continues to apply the force after power is removed.

As described above, the docking mechanism 300 employs fluid pressure to restore the piston 310 to its upper position within the chamber 312. Although a great deal of force is generally required to move the piston 310 to its lower position (for compressing the spring-loaded contacts within the test head and peripheral), relatively little force is generally required to restore the piston 310 to its upper position. Therefore, as an alternative to applying fluid pressure to restore the piston 310 to its upper position, a second biasing mechanism could be used to apply an upward biasing force to the piston 310. The second biasing mechanism, like the first biasing mechanism, could be a spring, an elastomeric material, or a permanent magnet. As yet another alternative, the piston 310 could simply be pulled to its upper position by manually applying a force to the latch barrel 350. Thus, fluid pressure and a second biasing mechanism could both be avoided.

For convenience and ease of maintenance, air has been described as the preferred fluid for applying fluid pressure to the moving parts of the docking mechanism 300. Other fluids, both gaseous and liquid, could be used in place of air. Using a fluid in the liquid state actually confers the benefit of allowing the chamber 312 to be reduced in size, as liquids can generally be delivered at higher pressures than gasses. Therefore, it is possible to make the docking mechanism 300 even smaller by using a liquid to supply the fluid pressure.

As described above, positive pressure is applied to actuate the moving parts of the docking mechanism 300. However, negative pressure (vacuum) can also be used with only minor adjustments to the design, which are known to those skilled in the art.

Preferably, as described above, o-rings are used in conjunction with o-ring grease at component couplings to prevent fluid leakage. Alternatively, greaseless o-rings can be used. As yet another alternative, o-rings can be omitted altogether and the dimensions of the piston and chamber could be closely matched, so that air leakage is reduced to acceptable levels (lapped seal). T-seals, lip seals, and other elastomeric seals may also be used.

In the description above, the docking mechanism 300 is attached to the test head and the receptacle is attached to the peripheral. Alternatively, this arrangement could be reversed, with the docking mechanism being attached to the peripheral and the receptacle being attached to the test head.

Each of these alternatives and variations, as well as others, has been contemplated by the inventors and is intended to fall within the scope of the instant invention. It should be understood, therefore, that the foregoing description is by way of example, and that the invention should be limited only by the spirit and scope of the appended claims.

What is claimed is:

1. A docking mechanism suitable for docking a test head with a peripheral, comprising:
 a latch barrel;
 a latchpin moveably disposed within the latch barrel;
 a forcing mechanism for applying a force to the latchpin in a first direction to establish a latched condition, said forcing mechanism producing substantially zero force and being substantially compliant to movement of the latchpin following a loss of power;
 a biasing mechanism for applying a biasing force opposite the first direction to the latchpin for establishing an unlatched condition, said biasing mechanism substantially maintaining its force following a loss of power;

a substantially hollow cylindrical chamber; and a piston having a first portion movably disposed within the chamber and a second portion extending from the first portion and through a hole in the chamber, wherein the piston is caused to move within the chamber in response to a fluid pressure applied to a surface of the piston, and wherein the latch barrel extends from an opening in the second portion of the piston.

2. A docking mechanism as recited in claim 1, wherein the forcing mechanism comprises a fluid pressure source arranged to apply a fluid pressure to move the latchpin relative to the latch barrel for establishing the latched condition.

3. A docking mechanism as recited in claim 2, wherein the biasing mechanism comprises a spring coupled to the latchpin and the latch barrel and exerting a force between the latchpin and the latch barrel.

4. A docking mechanism as recited in claim 1, wherein the forcing mechanism comprises a solenoid coupled to the latchpin to apply a force to move the latchpin relative to the latch barrel for establishing the latched condition.

5. A docking mechanism as recited in claim 4, wherein the biasing mechanism comprises a spring coupled to the latchpin and the latch barrel and exerting a force between the latchpin and the latch barrel.

6. A docking mechanism as recited in claim 1, wherein the piston is moved in a first direction in response to a fluid pressure applied to a first surface of the piston, and is moved in a second direction in response to a fluid pressure applied to a second surface of the piston.

7. A docking mechanism as recited in claim 1, wherein the latchpin, the latch barrel, and the piston are all concentrically aligned with respect to a vertical axis.

8. A docking mechanism as recited in claim 1, wherein the first portion of the piston has an upper surface, and the chamber includes a conduction path for providing fluid pressure to the upper surface of the piston, the fluid pressure provided by the conduction path tending to retract the second portion of the piston at least partially into the chamber.

9. A docking mechanism as recited in claim 8, wherein the conduction path has an opening into the chamber, and the upper surface of the first portion of the piston includes a relieved region that is coupled by fluid pressure to the opening into the chamber, wherein the relieved portion has a surface area large enough to convert the fluid pressure into a force sufficient to move the piston.

10. A docking mechanism as recited in claim 8, further comprising at least one fluid resistant seal between the piston and the chamber, which prevents a dissipation of fluid pressure applied via the conduction path.

11. A docking mechanism suitable for docking a test head with a peripheral, comprising:

a substantially hollow cylindrical chamber;

a piston having a first portion movably disposed within the chamber and a second portion extending from the first portion and through a hole in the chamber, wherein the piston is caused to move within the chamber in response to a fluid pressure applied to a surface of the piston; and a latching mechanism extending from an opening in the second portion of the piston for establishing a latched condition and an unlatched condition with the peripheral.

12. A docking mechanism as recited in claim 11, wherein the piston is moved in a first direction in response to a fluid pressure applied to a first surface of the piston, and is moved in a second direction in response to a fluid pressure applied to a second surface of the piston.

13. A docking mechanism as recited in claim 11, wherein the first portion of the piston has an upper surface, and the chamber includes a conduction path for providing fluid pressure to the upper surface of the piston, the fluid pressure provided by the conduction path tending to retract the second portion of the piston at least partially into the chamber.

14. A docking mechanism as recited in claim 13, wherein the conduction path has an opening into the chamber, and the upper surface of the first portion of the piston includes a relieved region that is coupled by fluid pressure to the opening into the chamber, wherein the relieved portion has a surface area large enough to convert the fluid pressure into a force sufficient to move the piston.

15. A docking mechanism as recited in claim 13, further comprising at least one fluid resistant seal between the piston and the chamber, which prevents a dissipation of fluid pressure applied via the conduction path.

16. A docking mechanism as recited in claim 13, wherein the first portion of the piston has a lower surface, and the chamber includes a second conduction path for providing fluid pressure to the lower surface of the piston, the fluid pressure tending to advance the second portion of the piston at least partially outside of the chamber.

17. A docking mechanism as recited in claim 16, wherein the second conduction path has an opening into the chamber, and the lower surface of the first portion of the piston includes a relieved region that is coupled by fluid pressure to the opening of the second conduction path into the chamber.

18. A docking mechanism as recited in claim 11, further comprising:

a latch barrel extending from an opening in the second portion of the piston;

a latchpin moveably disposed within the latch barrel;

a forcing mechanism for applying a force to the latchpin in a first direction to establish the latched condition, said forcing mechanism producing substantially zero force and being substantially compliant to movement of the latchpin following a loss of power, and a biasing mechanism for applying a biasing force opposite the first direction to the latchpin for establishing the unlatched condition, said biasing mechanism substantially maintaining its force following a loss of power.

19. A docking mechanism as recited in claim 18, wherein:

the second portion of the piston includes a substantially hollow region having at least one inner lateral surface; and the latchpin includes a base portion that makes contact with the at least one inner lateral surface of the substantially hollow region via a fluid resistant seal.

20. The docking mechanism as recited in claim 19, wherein the chamber has a second fluid conduction path for providing fluid pressure to the base portion of the latchpin.

21. The docking mechanism as recited in claim 20, wherein a force applied by the fluid pressure against the base portion of the latchpin tends to move the latchpin to the latched condition.

22. The docking mechanism as recited in claim 21, wherein the biasing mechanism comprises a spring.

23. The docking mechanism as recited in claim 22, wherein the latch barrel is moveably disposed within the second portion of the piston and partially extends through the opening in the second portion of the latch barrel.

24. The docking mechanism as recited in claim 23, wherein the spring is disposed coaxially with the latchpin and extends from the base portion of the latchpin to the latch barrel, thus exerting a repelling force between the latchpin and the latch barrel.

25. A docking mechanism suitable for docking a test head with a peripheral, comprising:
- a substantially hollow cylindrical chamber;
- a piston having a first portion movably disposed within the chamber and a second portion extending from the first portion and through a hole in the chamber, wherein the piston is caused to move within the chamber in response to a fluid pressure applied to a surface of the piston; and
- a latching mechanism for establishing a latched condition and an unlatched condition with the peripheral, the latching mechanism including a latch barrel extending from an opening in the second portion of the piston;
- a latchpin moveably disposed within the latch barrel;
- a forcing mechanism for applying a force to the latchpin in a first direction to establish the latched condition, said forcing mechanism producing substantially zero force and being substantially compliant to movement of the latchpin following a loss of power, and
- a biasing mechanism for applying a biasing force opposite the first direction to the latchpin for establishing the unlatched condition, said biasing mechanism substantially maintaining its force following a loss of power.

* * * * *